United States Patent [19]
Butler et al.

[11] 3,949,891
[45] Apr. 13, 1976

[54] SEMICONDUCTOR WAFER TRANSFER DEVICE

[75] Inventors: Robert M. Butler, Port Byron; George A. Anderson, III, East Syracuse, both of N.Y.

[73] Assignee: Micro Glass Inc., East Syracuse, N.Y.

[22] Filed: July 22, 1974

[21] Appl. No.: 490,517

[52] U.S. Cl. ................... 214/301; 53/246; 211/41; 211/126; 221/91
[51] Int. Cl.² ........................................ B65G 65/04
[58] Field of Search ............... 53/246; 211/41, 126; 221/69, 71, 72, 75, 77, 81–83, 86, 89, 91, 98, 99, 134; 214/300, 301, 307, 312

[56] References Cited
UNITED STATES PATENTS

| | | | |
|---|---|---|---|
| 1,286,810 | 12/1918 | Sheppard | 221/91 |
| 2,619,869 | 12/1952 | Stewart | 53/246 |
| 2,645,398 | 7/1953 | Anderson | 221/93 |
| 3,263,841 | 8/1966 | Wanesky | 214/300 |

*Primary Examiner*—Robert J. Spar
*Assistant Examiner*—Lawrence J. Oresky
*Attorney, Agent, or Firm*—Bruns & Jenney

[57] ABSTRACT

A device for permitting the simultaneous transfer of a plurality of silicon wafers from one wafer carrier to another, and particularly for permitting a mass transfer between carriers having different wafer spacings. The device comprises two rectangular frames with a portion of the upper frame extending into the lower frame. Both frames are provided with a plurality of wafer slots although in the lower frame there is a greater number of slots and they are more closely spaced than in the upper frame. Each frame is adapted to interface with and be releasably secured to a carrier having a like number of wafer slots. The upper frame is slidable within the lower frame and means are provided to register its slots with different groups of the slots in the lower frame. With such an arrangement, wafers from a carrier secured to the upper frame can be transferred to a particular group of slots in a carrier secured to the lower frame after which the upper frame can be moved so that its slots register with a different group of slots in the lower frame whereby another carrier can be secured to the upper frame and its wafers transferred to a different group of slots in the carrier secured to the lower frame.

4 Claims, 7 Drawing Figures

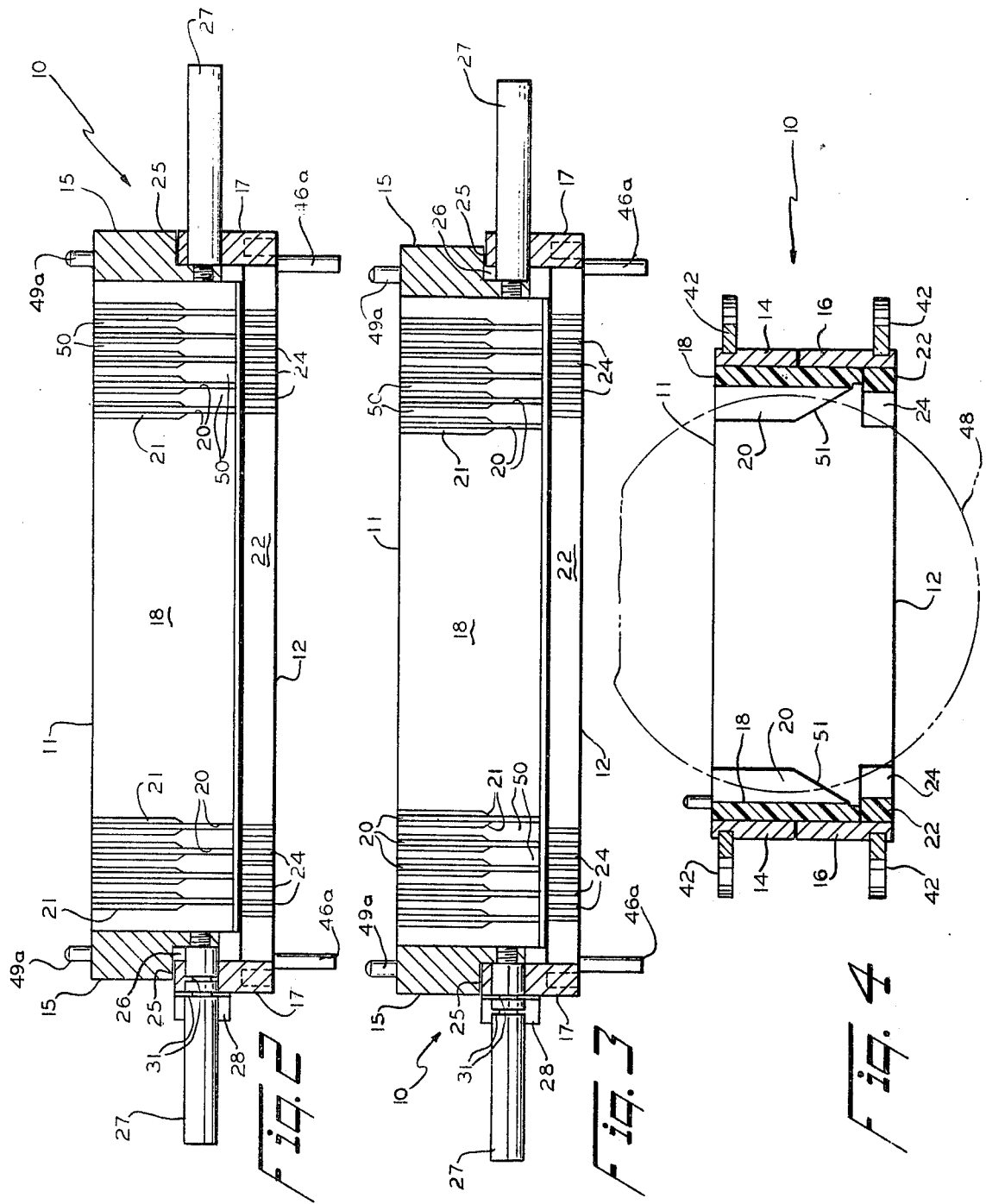

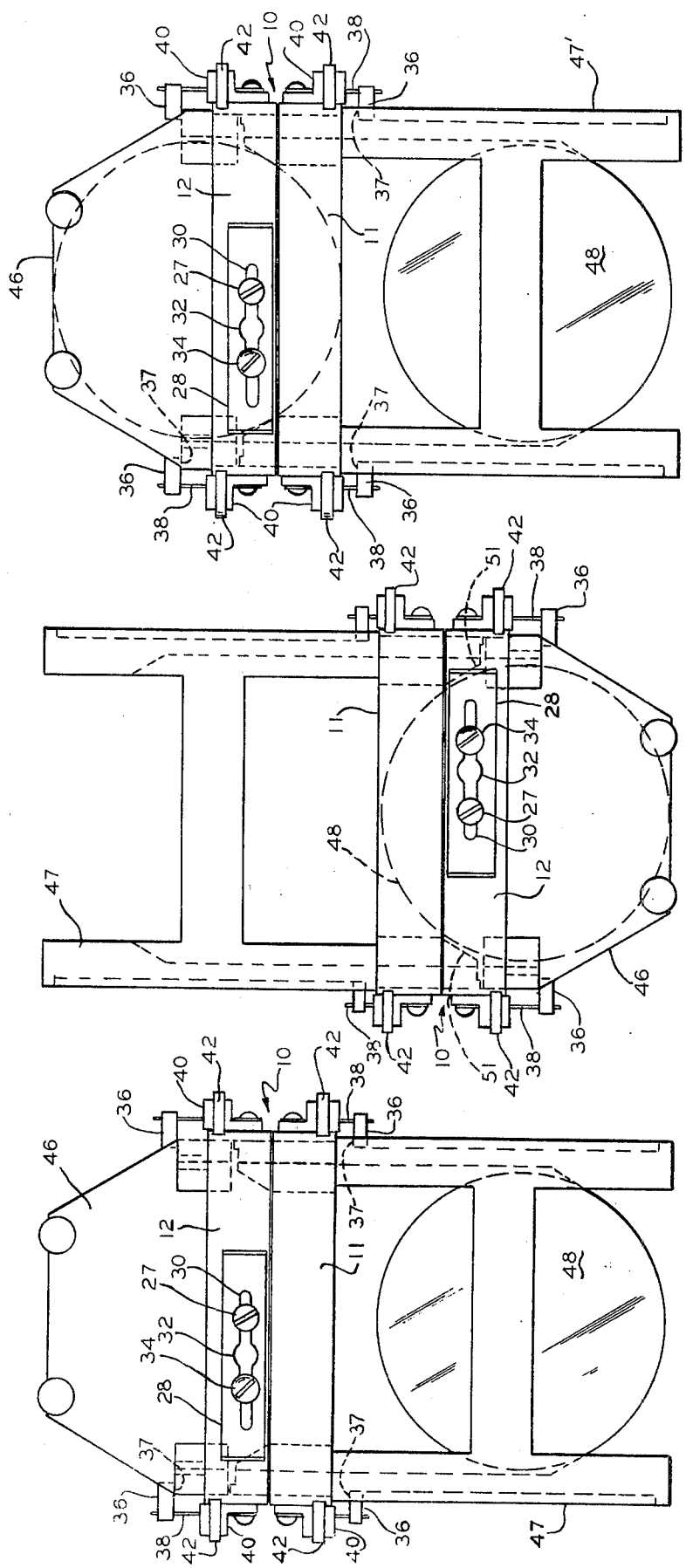

SEMICONDUCTOR WAFER TRANSFER DEVICE

BACKGROUND OF THE INVENTION

This invention relates broadly to the production of semiconductor devices, and has particular reference to a novel device for permitting the mass transfer of silicon wafers from one wafer carrier to another carrier that has different wafer spacings.

In the production of semiconductor devices and integrated circuits on thin wafers of semiconductor material such as silicon, a number of different operations under different conditions must be performed. Thus, in cleaning and coating operations greater spacing is required between the wafers than is required or desirable for furnace operations. The greater spacing enables more uniform cleaning and coating and results in more efficient drying. For furnace operations, on the other hand, the cost, time required and limited space make it desirable to space the wafers much closer together.

The wafers are supported during the production operations by racks or carriers of various known types, and from the foregoing brief description of the operations it will be apparent that the carriers must have different wafer spacings. Since the wafers cannot be handled manually after production operations have commenced, any transfer of wafers between carriers has heretofore been accomplished by operators using tweezers. This of course is a tedious task when a multiplicity of wafers is involved.

Recently, a number of the carrier manufacturers have cooperated in developing a series of standard, compatible carriers which interface with one another so that a mass transfer of the wafers can be effected by "dumping." This system, however, is not adapted for transfers between carriers with different wafer spacings and when such a transfer is required, it is usually necessary to revert to the tweezer method.

The closest prior art known to the applicants is disclosed in U.S. Pat. Nos. 3,394,819; 3,480,151; 3,486,631 and 3,534,862. These patents are in Class 211, subclasses 41 and 126 and disclose racks or carriers for wafers rather than a transfer device as disclosed herein.

SUMMARY OF THE INVENTION

The invention disclosed herein is directed to a device that is particularly adapted to permit the mass transfer of water-like elements between carriers having different wafer spacings. The device is of relatively simple construction and yet enables wafer transfer to be carried out efficiently and with a minimum possibility of damage to the fragile wafers.

The transfer device comprises an upper and a lower rectangular frame with a portion of the upper frame extending into the interior of the lower frame. Both frames are provided with a plurality of pairs of wafer slots but in the lower frame there is a greater number of slots and they are more closely spaced than in the upper frame. Each frame is adapted to interface with and be releasably secured to a standard wafer carrier having a like number of wafer slots.

The upper frame is slidable within the lower frame and means are provided to register its slots with two or more different groups of the slots in the lower frame. With this arrangement, wafers from a carrier secured to the upper frame can be dumped into a particular group of slots in a carrier secured to the lower frame, passing through registering slots in the transfer device during the transfer. Thereafter, the upper frame can be moved so that its slots register with a different group of slots in the lower frame whereby another carrier can be secured to the upper frame and its wafers dumped into a different group of slots in the carrier secured to the lower frame. The latter thus receives wafers from two or more carriers that interface with the upper frame.

BRIEF DESCRIPTION OF THE DRAWINGS

FIG. 2 is a longitudinal section through the device taken on line 2—2 of FIG. 1;

FIG. 3 is a sectional view corresponding to FIG. 2 with the upper frame shifted to its alternative position of slot registry;

FIG. 4 is a transverse section through the device taken on line 4—4 of FIG. 1;

FIG. 5 is an end elevation of the transfer device with an interfacing wafer carrier secured to the upper and lower frames, this view showing the position of the members prior to dumping the first batch of wafers from a carrier having relatively wide spacing into a carrier having narrower spacing;

FIG. 6 is a view corresponding to FIG. 5 showing the members inverted and the transfer of the first batch of wafers completed; and FIG. 7 is a view corresponding to FIG. 5 after a second inversion of the members, this view showing the position of the members after the upper frame of the transfer device has been shifted to its alternative position of slot registry and prior to dumping the second batch of wafers into the carrier with the narrower spacing.

DESCRIPTION OF THE PREFERRED EMBODIMENT

Figure 1:
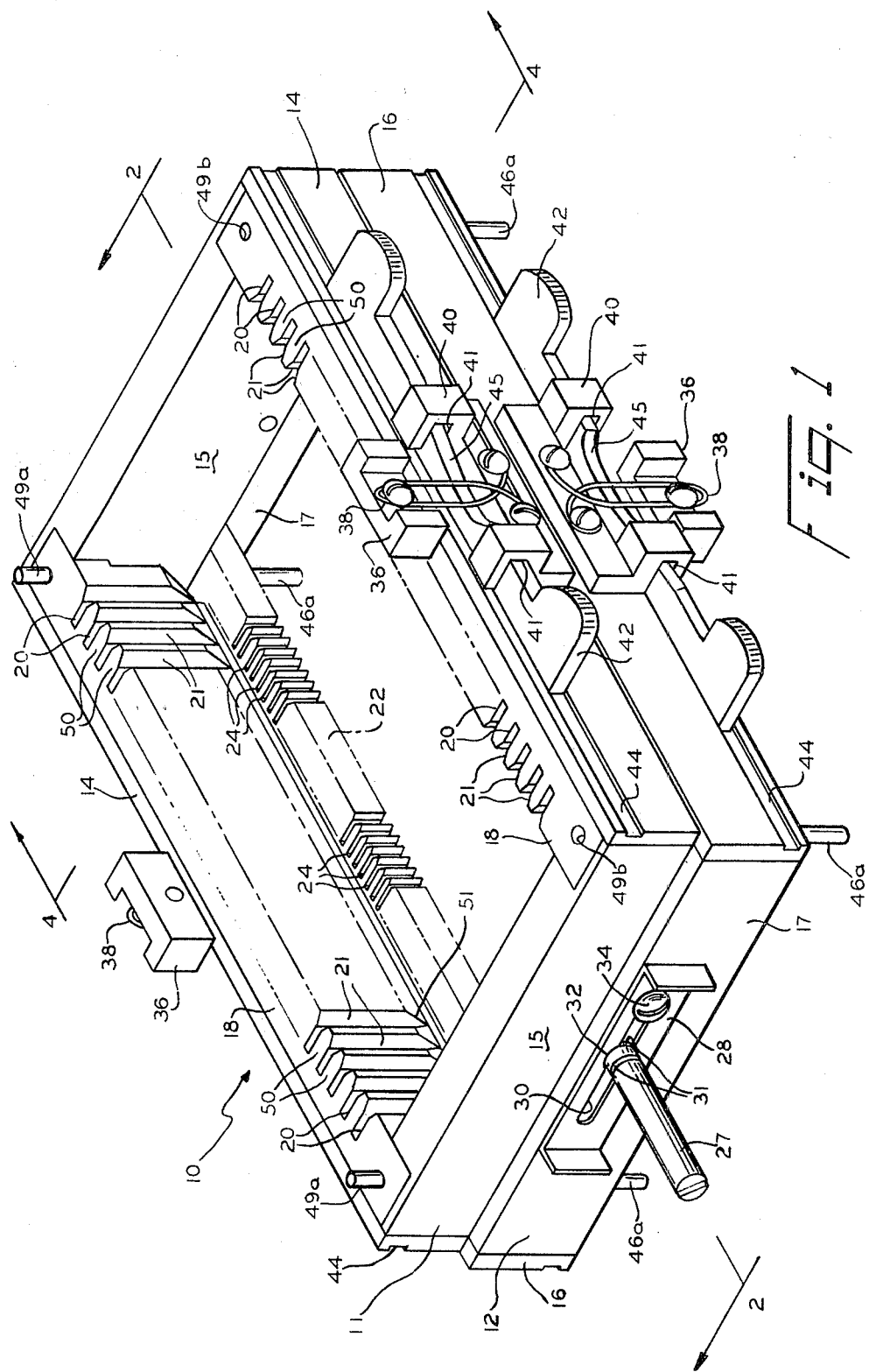
FIG. 1 is a perspective view of a wafer transfer device embodying the invention.

Having reference now to the drawings, and with particular reference to FIGS. 1–4, the wafer transfer device of the invention is indicated generally at 10 and is essentially comprised of an upper frame 11 and lower frame 12. The frames are rectangular with open interiors to permit the passage of the wafers therethrough. Upper frame 11 includes side rails (or walls) 14 and end rails (or walls) 15, while lower frame 12 includes side rails 16 and end rails 17. The two frames are of substantially equal width but the upper frame is slightly shorter than the lower frame as shown in FIGS. 1–3.

Positioned adjacent the inside of each upper frame side rail 14 is an insert 18 of a suitable material, the two inserts having oppositely disposed, uniformly spaced wafer slots 20 that are bevelled or chamfered at their open ends as at 21. Similarly, the lower frame is provided with inserts 22 adjacent its side rails which inserts have oppositely disposed, uniformly spaced wafer slots 24 that are bevelled at their open ends. In the embodiment of the invention disclosed herein, there are twice as many wafer slots in the lower frames as there are in the upper frame and the spacing between the slots in the lower frame is one-half the spacing between the upper frame slots. It should be understood, however, that if desired there can be three times as many slots in the lower frame, or any other whole number multiple, with a corresponding reduction in the spacing.

As best shown in FIGS. 2 and 3, the end rails 15 of the upper frame are reduced in thickness adjacent their lower edges and this results in the formation of shoulders 25. The shoulders 25 are spaced just above the upper edges of the lower frame end rails 17, and the reduced thickness portions of the rails 15 project down into the interior of the lower frame as shown. The overall length of the portion of the upper frame that projects into the lower frame is less than the interior length dimension of the lower frame so that there is a clearance between the frames as shown at 26 in FIGS. 2 and 3. This permits limited lengthwise movement of the upper frame relative to the lower frame.

In accord with the invention, the distance that the upper frame 11 can move is exactly equal to the center to center distance between two adjacent wafer slots in the lower frame 12. With this arrangement, when the right end of the upper frame abuts against the right end of the lower frame as shown in FIG. 2, the upper frame wafer slots 20 will register with every other one of the lower frame slots 24. When the upper frame is shifted so that its left end abuts against the left end of the lower frame as shown in FIG. 3, its slots 20 will register with the alternate group or series of lower frame slots 24, i.e. the slots with which slots 20 previously did not register.

The upper and lower frames of the wafer transfer device are held together by dowels 27 which project outwardly from the opposite pairs of end rails as shown in FIGS. 1–3. These dowels pass through the end rails 17 of the lower frame with a sliding fit and are threaded into the end rails 15 of the upper frame. In addition to holding the frames together, the dowels 27 can be used to shift the position of the upper frame and to guide such movement. The dowels are also utilized to rotate the frames as a unit during operation of the device as will be described hereinafter. From FIG. 4 it can be seen that the wafer slot inserts 18 of the upper frame extend below the side rails 14 of the latter and project down into the lower frame, the projecting portions of the inserts serving to aid the dowels 27 in guiding the shifting movement of the upper frame.

Latch or locking means are provided to positively hold the upper frame in its alternative positions of registry with the lower frame slots 24. This means includes the dowel 27 at the left end of the device, as viewed in FIGS. 1—3, and a cooperating slidable latch plate 28. Plate 28 has a horizontal slot 30 the width of which is less than the dowel diameter and the sides of this slot are adapted to be received in one or the other of two 360° grooves 31 in the dowel, see FIGS. 2 and 3.

Near its center, the latch plate slot 30 is enlarged to form a circular hole 32 through which the dowel can move freely in the axial direction to shift the position of the upper frame. Once in either of the positions of registry, the plate 28 is moved to the right (looking at the left end of the device in FIG. 1) so that the sides of slot 30 enter the aligned dowel groove 31 whereby further axial movement of the dowel is prevented. A shouldered screw 34 passes through the left end of the latch plate slot 30 to hold the plate against the lower frame end rail 17 and guide its sliding movement.

OPERATION

As pointed out above, in the embodiment of the invention disclosed herein there are twice as many wafer slots in the lower frame 12 as there are in the upper frame 11. The device 10 is therefore a two to one transfer device (or vice versa), and its operation will be described with reference to the mass transfer or dumping of silicon wafers from two identical wafer carriers each containing X wafers spaced a distance of 2Y apart into a single wafer carrier with a capacity of 2X wafers spaced Y distance apart. In this connection, it should be noted that the operation of the transfer device is essentially the same for different sizes of wafers and for different quantities and spacings.

It will be assumed that the transfer device 10 is being used in the transfer of wafers from two carriers each containing twenty-five wafers spaced ⅛ inch apart to a single carrier having a capacity of fifty wafers spaced 1/16 inch apart. In this case, the upper frame 11 is adapted to successively interface with the two twenty-five wafer carriers and its wafer slots 20 will register with the carrier wafer slots, being twenty-five in number with ⅛ inch spacing. The lower frame 12 is adapted to interface with the fifty wafer carrier and it will have fifty wafer slots with 1/16 inch spacing in registry with the wafer slots of the carrier.

Provision is made to releasably secure the upper and lower frames to their respective carriers and this includes for each frame a pair of oppositely disposed latch blocks 36 arranged to engage side ledges or shoulders 37, FIGS. 5–7, provided on most commercially available carriers for this purpose. The blocks are mounted on the outer ends of bent wire springs 38 and the inner ends of the springs are secured to brackets 40 mounted on the respective side rails of the two frames. Each bracket is formed with a pair of slots 41 which support a cam actuator lever 42 for sliding movement therein, the inner edge of the lever being received in a longitudinally extending groove 44 in the frame side rail. Each lever 42 is formed with an oblique cam surface 45 that is engaged by the wire spring 38 whereby lengthwise movement of the lever permits the latch blocks 36 to engage the ledges or shoulders 37 on the carriers or moves them out of engagement. The elongated cam surfaces 45 on the levers enable the latching means to adjust to variations as between carriers of different manufacture.

In effecting the transfer of wafers from two twenty-five wafer carriers to one fifty wafer carrier, the first step is to attach by means of the releasable latching means just described an empty fifty wafer carrier 46, FIGS. 5–7, to the lower or fifty slot frame 12 of the transfer device 10. As best shown in FIG. 1, the lower frame is provided with corner pins 46a which are received in corresponding holes in the carrier to insure precise registry of the frame wafer slots with those of the carrier. The fifty wafer carrier 46 may be a quartz "boat" that is particularly adapted for furnace operations where, as previously described, it is desirable to have the wafers closely spaced. Such a quartz boat has been manufactured for a number of years by the assignee of the present invention.

After the empty carrier 46 has been attached to the transfer device, the assembly is inverted and the upper frame 11 is attached as shown in FIG. 5 to a twenty-five wafer carrier 47 that is full of silicon wafers 48. As described before, carriers such as carrier 47, with twice the space between the wafers, are particularly adapted for cleaning and coating operations. As shown in FIG. 1, the upper frame is provided with corner pins and holes 49a, 49b which mate with correspondng holes and pins (not shown) in the carrier to insure precise registry of the frame wafer slots with those of the carrier. Following attachment to the carrier 47, the assembled transfer device and carriers are inverted as shown in FIG. 6 whereupon the wafers 48 are simultaneously transferred from carrier 47 to carrier 46. During this transfer or dumping operation, the twenty-five wafers pass through the twenty-five slots 20 of the device upper frame 11, through every other slot 24 of the fifty slot lower frame 12 and into every other slot of the fifty wafer carrier 46. During this operation, it makes no difference which of its alternative positions of registry the upper frame is in with respect to the lower frame.

Following the dumping operation just described, and while the carrier-transfer device assembly is still in the position shown in FIG. 6, the empty carrier 47 is removed and the latch plate 28 is moved to the left (as viewed in FIG. 6) to disengage it from the dowel 27. The upper frame 11 can then be shifted to its other position of registry and after this has been done the latch plate is reengaged with the dowel.

Following the shift of the upper frame, the transfer device and the still attached carrier 46 are again inverted and the upper frame is attached as shown in FIG. 7 to a second twenty-five wafer carrier 47' that is full of wafers 48. During this last inversion it is important to note that the twenty-five wafers that were previously dumped into every other slot of carrier 46 cannot fall out, following the shift of the upper frame, because they are retained in the carrier by the land areas 50, FIGS. 1-3, between the upper frame slots 20.

After attachment of the transfer device and carrier 46 to carrier 47', FIG. 7, the complete assembly is once again inverted causing the twenty-five wafers in carrier 47' to be dumped into every other slot in carrier 46, i.e. the slots between the previously deposited wafers. Following this final step, the assembly will be as shown in FIG. 6; the transfer device and carrier 47' can then be detached from carrier 46 leaving the latter with the fifty wafers it has received from carriers 47 and 47'. To transfer the wafers from carrier 46 back to carriers 47 and 47', the above-described sequence of operations is reversed.

In connection with the foregoing description of the operation of the device, it can be seen from FIGS. 1, 4 and 6 that the slotted inserts 18 of the upper frame are steeply bevelled at their lower ends as indicated at 51. As may be best seen from FIG. 6, these bevels enable the inserts to clear the wafers 48 when the upper frame is shifted following the deposit of the initial twenty-five wafers in carrier 46.

From the foregoing description, it will be apparent that the invention provides a highly novel and useful device for enabling the simultaneous transfer of a plurality of semiconductor wafers between carriers having different wafer spacings. As will be understood by those familiar with the art, the invention may be embodied in other specific forms without departing from the spirit or essential characteristics thereof.

We claim:

1. A device for transferring a plurality of waferlike elements from one carrier having a plurality of wafer supporting slots to another such carrier comprising an upper and a lower open frame, the walls of which form the perimeter about a completely open interior, each frame having a plurality of pairs of wafer slots, the slots in one of the frames being greater in number and more closely spaced than the slots in the other frame, means interconnecting the two frames so that limited shifting movement between the frames is permitted whereby the slots of the frame having the smaller number can be brought into registry with two or more different groups of the slots in the frame having the greater number, and means to releasably secure each frame in an interfacing relation to a wafer carrier having a corresponding number of slots, whereby wafer carriers can be releasably secured to the upper and lower open frames in order to transfer wafers from one carrier through said device into the other carrier.

2. A device as defined in claim 1 including releasable locking means to hold the frames against relative movement in each position of slot registry.

3. In a device for simultaneously transferring a plurality of wafer-like elements from one carrier having a plurality of wafer supporting slots to another such carrier having a different number of wafer supporting slots, an upper and a lower open rectangular frame having a completely open interior in partial telescopic engagement with one another, each of the frames having a plurality of slots for guiding a plurality of wafer-like elements through the frames, the slots in one of the frames being greater in number by a whole number multiple and correspondingly closer spaced than the slots in the other frame, means interconnecting the two frames so that limited longitudinal shifting movement between the frames is permitted whereby the slots of the frame having the smaller number can be brought into registry with two or more different groups of the slots in the frame having the greater number, and means to releasably secure each frame in an interfacing relation to a wafer carrier having a corresponding number of slots, whereby wafer carriers can be releasably secured to the upper and lower open frames in order to transfer wafers from one carrier through said device into the other carrier.

4. A device as defined in claim 3 including releasable locking means to hold the frames against relative movement in each position of slot registry.

* * * * *